(12) United States Patent
Thomas et al.

(10) Patent No.: US 9,904,177 B2
(45) Date of Patent: Feb. 27, 2018

(54) FLUID HANDLING STRUCTURE, A LITHOGRAPHIC APPARATUS AND A DEVICE MANUFACTURING METHOD

(75) Inventors: Ivo Adam Johannes Thomas, Son (NL); Coen Cornelis Wilhelmus Verspaget, Helmond (NL); Ronald Van Der Ham, Maarheeze (NL); Thibault Simon Mathieu Laurent, Eindhoven (NL); Gregory Martin Mason Corcoran, Eindhoven (NL); Ruud Hendrikus Martinus Johannes Bloks, Helmond (NL); Gerben Pieterse, Eindhoven (NL); Pieter Lein Joseph Gunter, Weert (NL)

(73) Assignee: ASML NETHERLANDS B.V., Veldhoven (NL)

( * ) Notice: Subject to any disclaimer, the term of this patent is extended or adjusted under 35 U.S.C. 154(b) by 831 days.

(21) Appl. No.: 13/592,068

(22) Filed: Aug. 22, 2012

(65) Prior Publication Data

US 2013/0050665 A1 Feb. 28, 2013

Related U.S. Application Data

(60) Provisional application No. 61/529,577, filed on Aug. 31, 2011.

(51) Int. Cl.
*G03B 27/52* (2006.01)
*G03F 7/20* (2006.01)
(52) U.S. Cl.
CPC ................ *G03F 7/70341* (2013.01)
(58) Field of Classification Search
CPC .................................................. G03F 7/70341
USPC ....................................................... 355/30, 72
See application file for complete search history.

(56) References Cited

U.S. PATENT DOCUMENTS

| 4,509,852 | A | 4/1985 | Tabarelli |
| 7,652,746 | B2 | 1/2010 | Jacobs et al. |
| 7,751,027 | B2 | 7/2010 | Jacobs |
| 7,804,575 | B2 | 9/2010 | Cadee et al. |

(Continued)

FOREIGN PATENT DOCUMENTS

| EP | 1 420 298 | 5/2004 |
| EP | 2 365 390 | 9/2011 |

(Continued)

OTHER PUBLICATIONS

Japanese Office Action dated Sep. 18, 2013 in corresponding Japanese Patent Application No. 2012-180193.

(Continued)

*Primary Examiner* — Deoram Persaud
(74) *Attorney, Agent, or Firm* — Pillsbury Winthrop Shaw Pittman, LLP

(57) ABSTRACT

A fluid handling structure, lithographic apparatus and device manufacturing method are disclosed. According to a disclosed embodiment, the fluid handling structure is configured to confine an immersion fluid in a space between a final element of a projection system and a facing surface during movement of the facing surface relative to the structure, wherein the structure has at least one heater to heat a portion of the facing surface adjacent to the heater, the at least one heater having a fluid heater to heat fluid flow from the structure onto the facing surface, the heater thereby heating the portion.

20 Claims, 7 Drawing Sheets

(56) References Cited

U.S. PATENT DOCUMENTS

| | | |
|---|---|---|
| 8,351,018 B2 | 1/2013 | Direcks et al. |
| 8,472,003 B2 | 6/2013 | Patel et al. |
| 8,564,763 B2 | 10/2013 | Jacobs et al. |
| 2004/0207824 A1 | 10/2004 | Lof |
| 2006/0033892 A1* | 2/2006 | Cadee et al. .............. 355/30 |
| 2006/0033898 A1 | 2/2006 | Cadee |
| 2006/0038968 A1 | 2/2006 | Kemper |
| 2006/0158627 A1 | 7/2006 | Kemper |
| 2006/0285096 A1 | 12/2006 | Jacobs et al. |
| 2007/0258060 A1 | 11/2007 | Chen |
| 2008/0212046 A1 | 9/2008 | Riepen |
| 2009/0135385 A1* | 5/2009 | Gellrich ............ G03F 7/70341 355/30 |
| 2009/0279060 A1 | 11/2009 | Direcks |
| 2009/0279061 A1 | 11/2009 | Jacobs |
| 2009/0279062 A1 | 11/2009 | Direcks |
| 2010/0245791 A1* | 9/2010 | Jacobs ............ G03F 7/70341 355/30 |
| 2010/0323303 A1* | 12/2010 | Nagasaka ......... G03F 7/70341 430/325 |
| 2011/0005603 A1 | 1/2011 | Patel et al. |
| 2011/0134401 A1 | 6/2011 | Rops |

FOREIGN PATENT DOCUMENTS

| | | |
|---|---|---|
| JP | 2006-054468 | 2/2006 |
| JP | 2007-005795 | 1/2007 |
| JP | 2007-184336 | 7/2007 |
| JP | 2009-272631 | 11/2009 |
| JP | 2009-272635 | 11/2009 |
| JP | 2011-014901 | 1/2011 |
| WO | WO 99/49504 | 9/1999 |
| WO | 2010/131781 | 11/2010 |

OTHER PUBLICATIONS

Japanese Office Action dated Mar. 24, 2016 in corresponding Japanese Patent Application No. 2012-180193.

* cited by examiner

FLUID HANDLING STRUCTURE, A LITHOGRAPHIC APPARATUS AND A DEVICE MANUFACTURING METHOD

This application claims priority and benefit under 35 U.S.C. § 119(e) to U.S. Provisional Patent Application No. 61/529,577, filed on Aug. 31, 2011. The content of that application is incorporated herein in its entirety by reference.

FIELD

The present invention relates to a fluid handling structure, a lithographic apparatus and a method for manufacturing a device using a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion fluid is handled by a fluid handling system, device structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

SUMMARY

Evaporation of immersion liquid from the surface of the substrate, or from a surface in close proximity to the substrate, may cause localized cooling of the substrate. Localized cooling of the substrate causes the cooled part of the substrate to contract, distorting the substrate resulting in an error in measurement of a feature on the substrate. Such unequal distortion of the substrate can reduce overlay accuracy of features imaged on the substrate. The localized cooling of the substrate may also cause cooling of immersion liquid that comes into contact with the substrate. Cooling of the immersion liquid may lead to a change in the refractive index of the immersion liquid, which may cause imaging errors and reduced overlay accuracy.

The cooling load on the substrate may vary as a function of position. Cooling may tend to be greater in a region of greater fluid flow, for example over the surface of the substrate or liquid in contact with the surface of the substrate. For example, the cooling load may tend to be high around a peripheral edge of the substrate due to the presence of fluid flow in this region, for example as a consequence of the action of a pumping system. In this region the surface of the substrate table outward of the substrate is spaced apart from the substrate, when supported by the substrate table, and is generally co-planar with the substrate. The part of the substrate table which supports the substrate, i.e. a substrate support, is therefore a recess within the surface of the substrate table. A cooling fluid may flow in the gap between the periphery of the substrate and part of the substrate table outward of the substrate.

The cooling load may tend to be high in a region of the substrate which moves under the immersion space, due to the evaporative effect of liquid at the periphery, e.g. the meniscus, of the liquid confined by the liquid confinement structure. For example, in a liquid confinement structure with a gas seal (for example an "air knife") which forms a gas flow to contain the immersion liquid, the gas flow generated by the gas seal may increase the evaporation of immersion liquid, for example at the meniscus of the liquid within the liquid confinement structure, which may tend to cool the substrate.

A region of a substrate over which the immersion space recently passed may tend to have a larger cooling load than one or more other regions of the substrate. The higher cooling load may be due to evaporation of immersion liquid left behind on the substrate surface after the substrate moves from under the liquid confinement structure.

Cooling of the substrate can be compensated to a degree by controlling the temperature of the substrate table supporting the substrate. For example, a system of channels may be formed within the substrate table. The temperature of the substrate table may then be controlled by controlling the temperature and/or pressure of fluid driven through the channels. One or more heaters may be provided in and/or on the substrate table. For example, a heater may be provided in at or near to the substrate table in the outer part of the recessed part of the substrate table which supports the substrate. The heater may be beneath a peripheral edge of the substrate, when supported by the substrate table. The heater is arranged to compensate for a cooling effect at an edge of the recessed region.

One or more sensors may be provided in or on the substrate table to monitor the temperature of the substrate as a function of position. A control system may be provided to control the output from a heater or a system of heaters in response to the output from the temperature sensor(s). To improve efficiency a large number of heaters and temperature sensors may be provided to cope with spatial variations in the cooling loads. However, the provision of a large number of heaters and sensors increases the complexity, expense, and weight of the substrate table. It may also be difficult to transfer heat efficiently between the substrate table and the substrate, leading to slow response times and/or reduction in the accuracy of compensation.

These challenges may become more extreme in systems that are adapted to accommodate substrates larger than the current industry standards, for example substrates having a diameter of 300 mm or more, for example 450 mm. A peripheral edge of such a larger substrate is longer (e.g., a longer circumference). Cooling at the periphery of such a substrate occurs over a portion of a longer periphery (e.g., circumference). Consequential thermal deformations may accumulate over longer distances, leading to increased risk of a larger overlay error. For designs involving many sensors and heaters, even more sensors and heaters may be required to cover the larger surface area of the substrate. The total power required by heating systems may increase. The flow rate to channels within the substrate table may need to be increased, increasing the control complexity of the thermal conditioning system.

It is desirable, for example, to provide an improved system to compensate for cooling of the substrate due to the presence of the immersion liquid.

According to an aspect, there is provided a fluid handling structure for a lithography apparatus, the structure configured to confine an immersion fluid in a space between a final element of a projection system and a facing surface during movement of the facing surface relative to the structure, wherein the structure comprises at least one heater to heat a portion of the facing surface adjacent to the heater, the at least one heater comprising a fluid heater to heat fluid flow from the structure onto the facing surface, the at least one heater thereby heating the portion.

According to an aspect, there is provided a fluid handling structure for a lithography apparatus, the structure configured to confine an immersion fluid in a space between a final element of a projection system and a facing surface during movement of the facing surface relative to the structure, wherein the structure comprises at least one heater to heat a portion of the facing surface adjacent to the at least one heater, the at least one heater comprising a plurality of elements arranged in a closed path around the space.

According to an aspect, there is provided a fluid handling structure for a lithography apparatus, the structure configured to confine an immersion fluid in a space between a final element of a projection system and a facing surface during movement of the facing surface relative to the structure, the structure comprising at least one sensor to measure the temperature of a portion of the facing surface underneath the at least one sensor.

According to an aspect, there is provided a fluid handling structure for a lithography apparatus, the structure configured to confine an immersion fluid in a space between a final element of a projection system and a facing surface during movement of the facing surface relative to the structure, and configured such that the area of contact of the immersion fluid with the facing surface in the space is greater than 9500 $mm^2$.

According to an aspect, there is provided a fluid handling structure for a lithography apparatus, the structure configured to confine an immersion fluid in a space between a final element of a projection system and a facing surface during movement of the facing surface relative to the structure, and configured such that the ratio of the area of contact of the immersion fluid with the facing surface in the space to the area of a substrate that can be exposed with radiation at a given time is greater than 60.

According to an aspect, there is provided a method of operating a lithography apparatus, comprising: projecting a patterned beam of radiation through an immersion liquid confined to a space between a final element of a projection system and a facing surface by a fluid handling structure; moving the facing surface relative to the fluid handling structure while maintaining confinement of the immersion liquid; and using at least one heater to heat a portion of the facing surface adjacent to the heater, the at least one heater comprising a fluid heater to heat fluid flow from the structure onto the facing surface, the at least one heater thereby heating the portion.

According to an aspect, there is provided a method of operating a lithography apparatus, comprising: projecting a patterned beam of radiation through an immersion liquid confined to a space between a final element of a projection system and a facing surface by a fluid handling structure; moving the facing surface relative to the fluid handling structure while maintaining confinement of the immersion liquid; and using at least one heater to heat a portion of the facing surface adjacent to the at least one heater, the at least one heater comprising a plurality of elements arranged in a closed path around the space.

According to an aspect, there is provided a method of operating a lithography apparatus, comprising: projecting a patterned beam of radiation through an immersion liquid confined to a space between a final element of a projection system and a facing surface by a fluid handling structure; moving the facing surface relative to the fluid handling structure while maintaining confinement of the immersion liquid; and using at least sensor forming part of the fluid handling structure to measure the temperature of a portion of the facing surface underneath the at least one sensor.

According to an aspect, there is provided a method of operating a lithography apparatus, comprising: projecting a patterned beam of radiation through an immersion liquid confined to a space between a final element of a projection system and a facing surface by a fluid handling structure;

and moving the facing surface relative to the fluid handling structure while maintaining confinement of the immersion liquid; wherein the structure is configured such that the area of contact of the immersion fluid with the facing surface in the space is greater than 9500 mm$^2$.

According to an aspect, there is provided a method of operating a lithography apparatus, comprising: projecting a patterned beam of radiation through an immersion liquid confined to a space between a final element of a projection system and a facing surface by a fluid handling structure; and moving the facing surface relative to the fluid handling structure while maintaining the confinement of the immersion liquid; wherein the structure is configured such that the ratio of the area of contact of the immersion fluid with the facing surface in the space to the area of a substrate that can be exposed with radiation at a given time is greater than 60.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
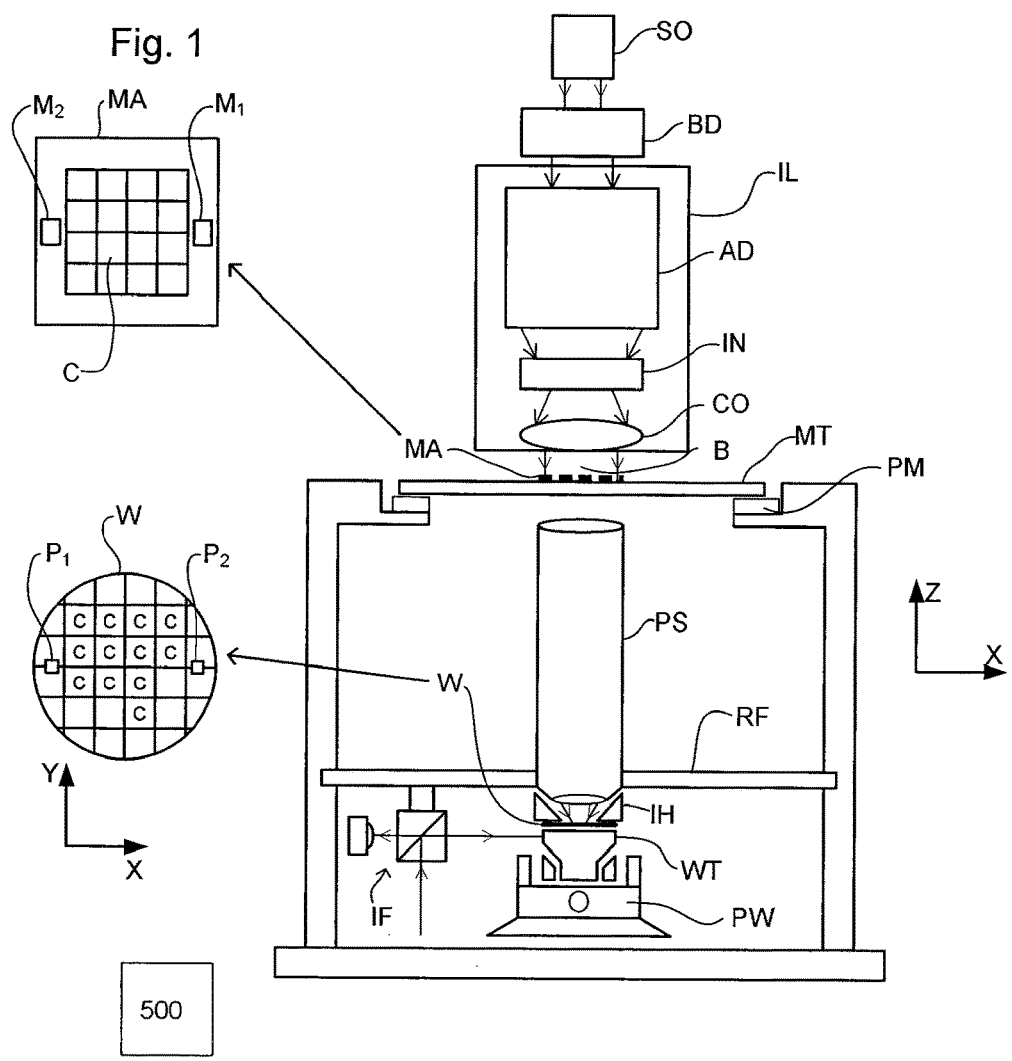
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device MA in accordance with certain parameters;

a support table, e.g. table to support one or more objects, for example a sensor table to support one or more sensors or a substrate table WT constructed to hold a substrate (e.g. a resist-coated substrate) W optionally with one or more sensors, connected to a second positioner PW configured to accurately position the surface of the table, for example of a substrate W, in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two or more tables (or stages or supports), e.g., two or more substrate tables or a combination of one or more substrate tables and one or more cleaning, sensor or measurement tables. For example, in an embodiment, the lithographic apparatus is a multi-stage apparatus comprising two or more tables located at the exposure side of the projection system, each table comprising and/or holding one or more objects. In an embodiment, one or more of the tables may hold a radiation-sensitive substrate. In an embodiment, one or more of the tables may hold a sensor to measure radiation from the projection system. In an embodiment, the multi-stage apparatus comprises a first table configured to hold a radiation-sensitive substrate (i.e., a substrate table) and a second table not configured to hold a radiation-sensitive substrate (referred to hereinafter generally, and without limitation, as a measurement, sensor and/or cleaning table). The second table may comprise and/or may hold one or more objects, other than a radiation-sensitive substrate. Such one or more objects may include one or more selected from the following: a sensor to measure radiation from the projection system, one or more alignment marks, and/or a cleaning device (to clean, e.g., the liquid confinement structure).

In such "multiple stage" (or "multi-stage") machines the multiple tables may be used in parallel, or preparatory steps may be carried out on one or more tables while one or more other tables are being used for exposure. The lithographic apparatus may have two or more patterning device tables (or stages or support) which may be used in parallel in a similar manner to substrate, cleaning, sensor and/or measurement tables.

In an embodiment, the lithographic apparatus may comprise an encoder system to measure the position, velocity, etc. of a component of the apparatus. In an embodiment, the component comprises a substrate table. In an embodiment, the component comprises a measurement and/or sensor and/or cleaning table. The encoder system may be in addition to or an alternative to the interferometer system described herein for the tables. The encoder system comprises a sensor, transducer or readhead associated, e.g., paired, with a scale or grid. In an embodiment, the movable component (e.g., the substrate table and/or the measurement and/or sensor and/or cleaning table) has one or more scales or grids and a frame of the lithographic apparatus with respect to which the component moves has one or more of sensors, transducers or readheads. The one or more of sensors, transducers or readheads cooperate with the scale(s) or grid(s) to determine the position, velocity, etc. of the component. In an embodiment, a frame of the lithographic apparatus with respect to which a component moves has one or more scales or grids and the movable component (e.g., the substrate table and/or the measurement and/or sensor and/or cleaning table) has one or more of sensors, transducers or readheads that cooperate with the scale(s) or grid(s) to determine the position, velocity, etc. of the component.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table INT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions C (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Although specific reference may be made in this text to the use of lithographic apparatus in the manufacture of ICs, it should be understood that the lithographic apparatus described herein may have other applications in manufacturing components with microscale, or even nanoscale, features, such as the manufacture of integrated optical systems, guidance and detection patterns for magnetic domain memories, flat-panel displays, liquid-crystal displays (LCDs), thin-film magnetic heads, etc.

Arrangements for providing liquid between a final element of the projection system PS and the substrate can be classed into three general categories. These are the bath type arrangement, the so-called localized immersion system and the all-wet immersion system. In a bath type arrangement substantially the whole of the substrate W and optionally part of the substrate table WT is submersed in a bath of liquid.

A localized immersion system uses a liquid supply system in which liquid is only provided to a localized area of the substrate. The space filled by liquid is smaller in plan than the top surface of the substrate and the area filled with liquid remains substantially stationary relative to the projection system PS while the substrate W moves underneath that area. FIGS. 2-6 show different supply devices which can be used in such a system. A sealing feature is present to seal liquid to the localized area. One way which has been proposed to arrange for this is disclosed in PCT patent application publication no. WO 99/49504.

In an all wet arrangement the liquid is unconfined. The whole top surface of the substrate and all or part of the substrate table is covered in immersion liquid. The depth of the liquid covering at least the substrate is small. The liquid may be a film, such as a thin film, of liquid on the substrate. Immersion liquid may be supplied to or in the region of a projection system and a facing surface facing the projection system (such a facing surface may be the surface of a substrate and/or a substrate table). Any of the liquid supply devices of FIGS. 2-5 can also be used in such a system.

However, a sealing feature is not present, not activated, not as efficient as normal or otherwise ineffective to seal liquid to only the localized area.

Figure 2:
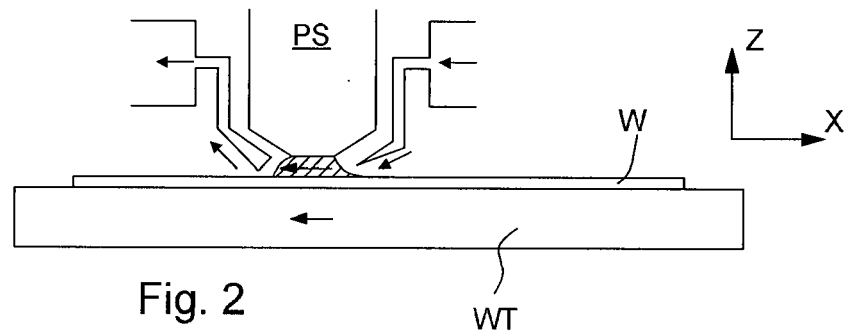
FIGS. 2 and 3 depict a liquid supply system for use in a lithographic projection apparatus.
Figure 3:
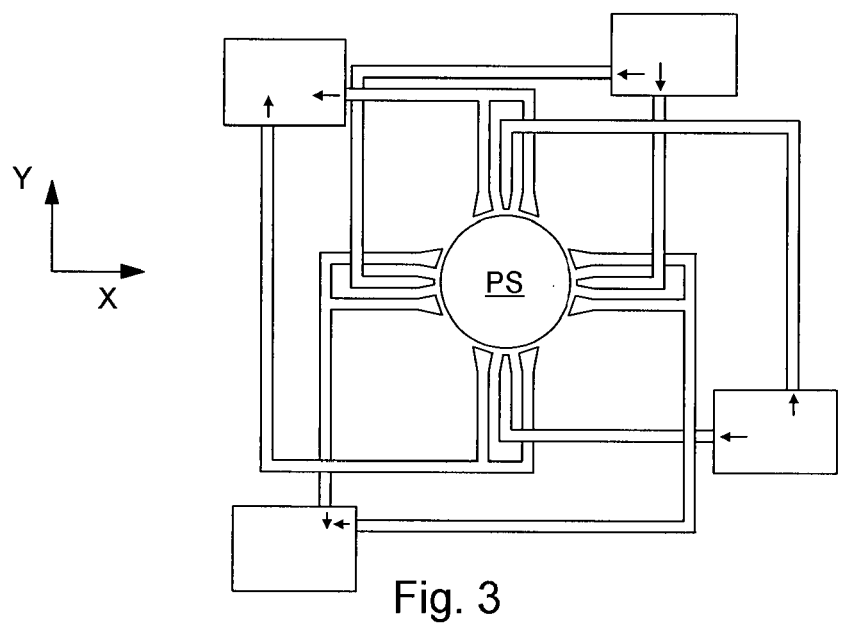

As illustrated in FIGS. 2 and 3, liquid is supplied by at least one inlet onto the substrate, preferably along the direction of movement of the substrate relative to the final element. Liquid is removed by at least one outlet after having passed under the projection system. As the substrate is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. In the illustration of FIG. 2 the liquid is supplied along the direction of movement of the substrate relative to the final element, though this does not need to be the case. Various orientations and numbers of in- and out-lets positioned around the final element are possible; one example is illustrated in FIG. 3 in which four sets of an inlet with an outlet on either side are provided in a regular pattern around the final element. Note that the direction of flow of the liquid is shown by arrows in FIGS. 2 and 3.

Figure 4:
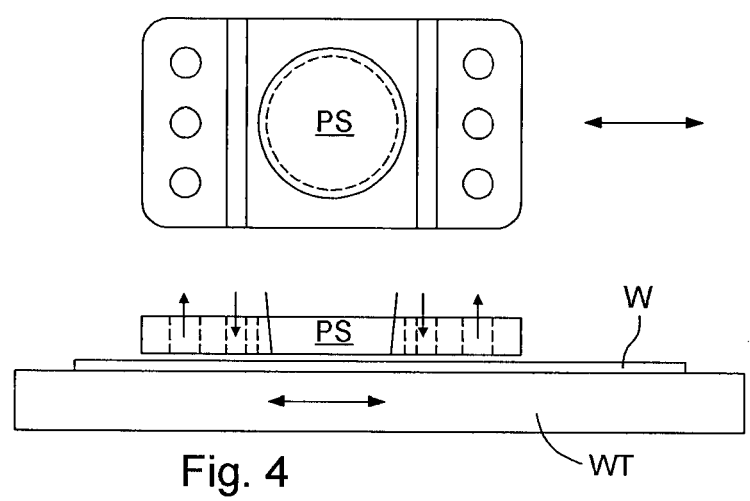
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets can be arranged in a plate with a hole in its centre and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). Note that the direction of flow of fluid and of the substrate is shown by arrows in FIG. 4.

Another arrangement which has been proposed is to provide the liquid supply system with a liquid confinement structure which extends along at least a part of a boundary of the space between the final element of the projection system and the substrate table. Such an arrangement is illustrated in FIG. 5.

In an embodiment, the lithographic apparatus comprises a liquid confinement structure that has a liquid removal device having an inlet covered with a mesh or similar porous material. The mesh or similar porous material provides a two-dimensional array of holes contacting the immersion liquid in a space between the final element of the projection system and a movable table (e.g., the substrate table). In an embodiment, the mesh or similar porous material comprises a honeycomb or other polygonal mesh. In an embodiment, the mesh or similar porous material comprises a metal mesh. In an embodiment, the mesh or similar porous material extends all the way around the image field of the projection system of the lithographic apparatus. In an embodiment, the mesh or similar porous material is located on a bottom surface of the liquid confinement structure and has a surface facing towards the table. In an embodiment, the mesh or similar porous material has at least a portion of its bottom surface generally parallel with a top surface of the table.

Figure 5:
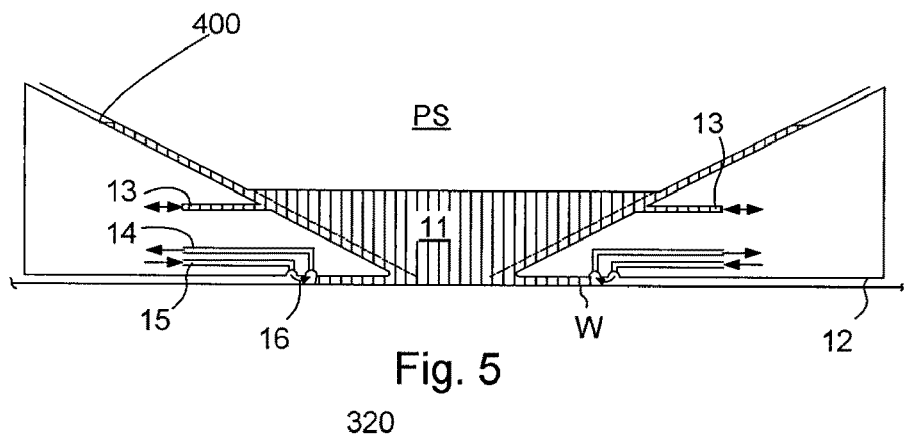
FIG. 5 depicts a further liquid supply system for use in a lithographic projection apparatus.

FIG. 5 schematically depicts a localized liquid supply system or liquid handling structure 12, which extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise. Reference to substrate table WT includes reference to a sensor located on the substrate table, unless expressly stated otherwise) The liquid handling structure 12 is substantially stationary relative to the projection system in the XY plane though there may be some relative movement in the Z direction (in the direction of the optical axis). In an embodiment, a seal is formed between the liquid handling structure 12 and the surface of the substrate W and may be a contactless seal such as a gas seal (such a system with a gas seal is disclosed in European patent application publication no. EP-A-1,420,298) or liquid seal.

The liquid handling structure 12 at least partly contains liquid in the space 11 between a final element of the projection system PS and the substrate W. A contactless seal 16 to the substrate W may be formed around the image field of the projection system PS so that liquid is confined within the space between the substrate W surface and the final element of the projection system PS. The space 11 is at least partly formed by the liquid handling structure 12 positioned below and surrounding the final element of the projection system PS. Liquid is brought into the space below the projection system PS and within the liquid handling structure 12 by liquid inlet 13. The liquid may be removed by liquid outlet 13. The liquid handling structure 12 may extend a lithe above the final element of the projection system. The liquid level rises above the final element so that a buffer of liquid is provided. In an embodiment, the liquid handling structure 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

The liquid may be contained in the space 11 by a gas seal 16 which, during use, is formed between the bottom of the liquid handling structure 12 and the surface of the substrate W. The gas seal is formed by gas. The gas in the gas seal is provided under pressure via inlet 15 to the gap between the liquid handling structure 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the liquid handling structure 12 and the substrate W contains the liquid in a space 11. The inlets/outlets may be annular grooves which surround the space 11. The annular grooves may be continuous or discontinuous. The flow of gas 16 is effective to contain the liquid in the space 11. Such a system is disclosed in United States patent application publication no. US 2004-0207824, which is hereby incorporated by reference in its entirety. In an embodiment, the liquid handling structure 12 does not have a gas seal, but may have a contactless seal other than a gas seal.

Figure 6:
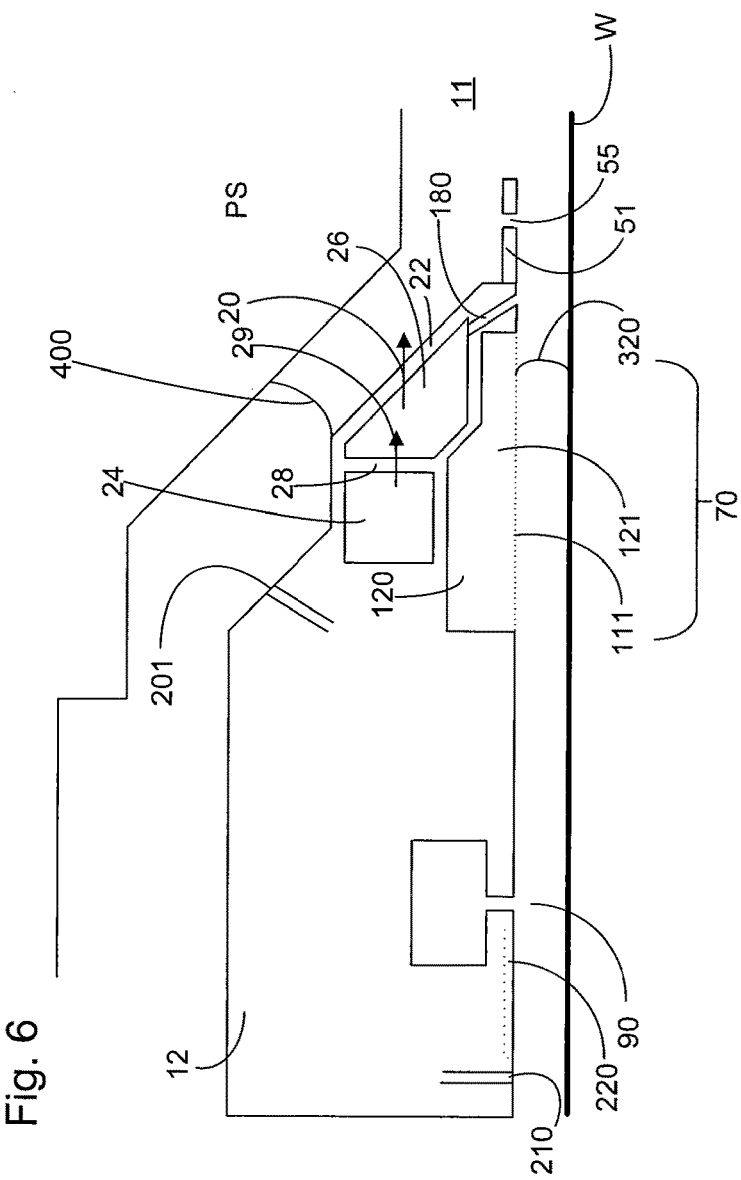
FIG. 6 depicts, in cross-section, a further liquid supply system for use in a lithographic projection apparatus.

FIG. 6 illustrates a liquid handling structure 12 which is part of a liquid supply system. The liquid handling structure 12 extends around the periphery (e.g. circumference) of the final element of the projection system PS.

A plurality of openings 20 in the surface which in part defines the space 11 provides the liquid to the space 11. The liquid passes through openings 29, 20 in side walls 28, 22 respectively through respective chambers 24, 26 prior to entering the space 11.

A seal is provided between the bottom of the liquid handling structure 12 and a facing surface, e.g. the substrate W, or a substrate table WT, or both. In FIG. 6 a seal device is configured to provide a contactless seal and is made up of several components. Radially outwardly from the optical axis of the projection system PS, there is provided a (optional) flow control plate 51 which extends into the space 11. The control plate 51 may have an opening 55 to permit flow liquid therethrough; the opening 55 may be beneficial if the control plate 51 is displaced in the Z direction (e.g., parallel to the optical axis of the projection system PS). Radially outwardly of the flow control plate 51 on the bottom surface of the liquid handling structure 12 facing (e.g., opposite) the facing surface, e.g., the substrate W, may be an opening 180. The opening 180 can provide liquid in a direction towards the facing surface. During imaging this may be useful in preventing bubble formation in the immersion liquid by filling a gap between the substrate W and substrate table WT with liquid.

Radially outwardly of the opening 180 may be an extractor assembly 70 to extract liquid from between the liquid handling structure 12 and the facing surface. The extractor assembly 70 may operate as a single phase or as a dual phase extractor. The extractor assembly 70 acts as a meniscus pinning feature of a meniscus 320 of the liquid.

Radially outwardly of the extractor assembly may be a gas knife 90. An arrangement of the extractor assembly and gas knife is disclosed in detail in United States patent application publication no. US 2006/0158627 incorporated herein in its entirety by reference.

The extractor assembly 70 as a single phase extractor may comprise a liquid removal device, extractor or inlet such as the one disclosed in United States patent application publication no. US 2006-0038968, incorporated herein in its entirety by reference. In an embodiment, the liquid removal device 70 comprises an inlet 120 which is covered in a porous material 111 which is used to separate liquid from gas to enable single-liquid phase liquid extraction. An under pressure in chamber 121 is chosen is such that the meniscuses formed in the holes of the porous material 111 prevent ambient gas from being drawn into the chamber 121 of the liquid removal device 70. However, when the surface of the porous material 111 comes into contact with liquid there is no meniscus to restrict flow and the liquid can flow freely into the chamber 121 of the liquid removal device 70.

Radially outward of gas knife 90 may be provided one or more outlets 210 to remove gas from gas knife 90 and/or liquid that may escape past the gas knife 90. The one or more outlets 210 may be located between one or more outlets of the gas knife 90. To facilitate channeling of fluid (gas and/or liquid) to the outlet 210, a recess 220 may be provided in the liquid confinement structure 12 that is directed toward outlet 210 from outlets of the gas knife 90 and/or from between outlets of the gas knife 90. The porous material 111 has a large number of small holes each with a dimension, e.g. a width, such as a diameter, in the range of 5 to 100 micrometers, desirably 5 to 50 micrometers. The porous material 111 may be maintained at a height in the range of 50 to 300 micrometers above a surface, such as a facing surface, from which liquid is to be removed, e.g. the surface of a substrate W. In an embodiment, porous material 111 is at least slightly liquidphilic, i.e. having a dynamic contact angle of less than 90°, desirably less than 85° or desirably less than 80°, to the immersion liquid, e.g. water.

Although not specifically illustrated in FIG. 6, the liquid supply system has an arrangement to deal with variations in the level of the liquid. This is so that liquid which builds up between the projection system PS and the liquid confinement structure 12 (and forms a meniscus 400) can be dealt with and does not escape. One way of dealing with this liquid is to provide a lyophobic (e.g., hydrophobic) coating. The coating may form a band around the top of the liquid handling structure 12 surrounding the opening and/or around the last optical element of the projection system PS. The coating may be radially outward of the optical axis of the projection system PS. The lyophobic (e.g., hydrophobic) coating helps keep the immersion liquid in the space 11. Additionally or alternatively, one or more outlets 201 may be provided to remove liquid reaching a certain height relative to the structure 12.

Another localized area arrangement is a liquid handling structure which makes use of a gas drag principle. The so-called gas drag principle has been described, for example, in United States patent application publication nos. US 2008-0212046, US 2009-0279060 and US 2009-0279062. In that system the extraction holes are arranged in a shape which may desirably have a corner. The corner may be aligned with a preferred direction of movement, such as the stepping or the scanning direction. This reduces the force on the meniscus between two openings in the surface of the liquid handing structure for a given speed in the preferred direction compared to if the two outlets were aligned perpendicular to the preferred direction. However, an embodiment of the invention may be applied to a liquid handling system which in plan has any shape, or has a component such as the extraction openings arranged in any shape. Such a shape in a non-limiting list may include an ellipse such as a circle, a rectilinear shape such as a rectangle, e.g. a square, or a parallelogram such as a rhombus or a cornered shape with more than four corners such as a four or more pointed star.

In a variation of the system of US 2008/0212046 A1, to which an embodiment of the present invention may relate, the geometry of the cornered shape in which the openings are arranged allows sharp corners (between about 60° and 90°, desirably between 75° and 90° and most desirably between 75° and 85°) to be present for the corners aligned both in the scan and in the stepping directions. This allows increased speed in the direction of each aligned corner. This is because the creation of liquid droplets due to an unstable meniscus, for example in exceeding a critical speed, in the scanning direction is reduced. Where corners are aligned with both the scanning and stepping directions, increased speed may be achieved in those directions. Desirably the speed of movement in the scanning and stepping directions may be substantially equal.

Figure 7:
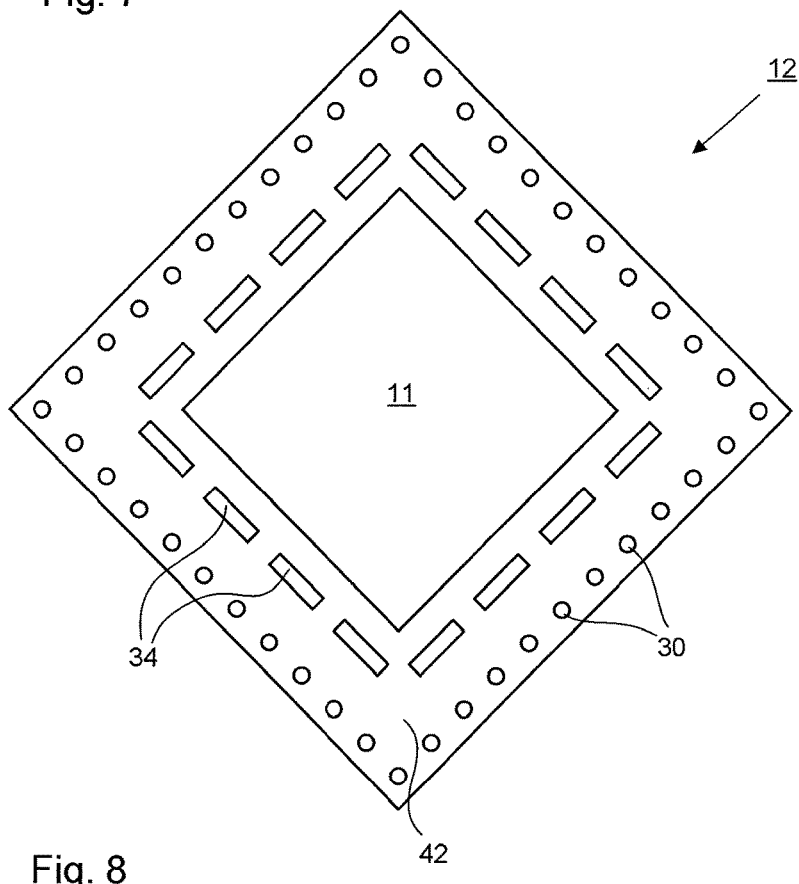
FIG. 7 depicts a liquid handling structure comprising a plurality of heaters and sensors.

FIG. 7 is a schematic bottom view of a liquid handling structure 12 for a lithography apparatus according to an example embodiment. As described for preceding embodiments, the structure 12 is configured to confine an immersion fluid within a space 11 between a final element of a projection system PS and a substrate W during movement of the substrate W relative to the structure 12. In an embodiment, the liquid handling structure 12 comprises at least one heater 34 to heat a portion of a surface facing, e.g. underneath, the liquid handling structure 12, such as a surface of the substrate W. The portion of the surface is, at that time, adjacent to the heater 34.

In a system where heaters are provided in the substrate table, a relatively large number of heaters may be necessary if it is desired to heat many different portions of the facing surface independently. In the arrangement of FIG. 7 a relatively small number of heaters 34 can provide independent heating at a large number of positions. For example, the heaters can be configured to apply heating at different times. By heating at different times, the heating is applied at different positions on the facing surface due to the relative movement between the table WT and the liquid handling structure 12.

In the arrangement shown in FIG. 7, the liquid handling structure 12 comprises at least one sensor 30 to measure the temperature of a portion of the facing surface, such as a surface of the substrate W, underneath and/or adjacent to the sensor 30. In another system sensors are provided in the substrate table WT. In such a system, a relatively large number of sensors may be required if it desired to measure the temperature independently at a large number of positions on the substrate W. According to the present embodiment, a relatively small number of sensors 30 can provide independent measurements of temperature at a large number of positions. The sensor system may take temperature measurements, for example, at different times or simultaneously. By taking measurements at different times, the temperature measurements are made at different positions on the facing surface due to the relative movement between the table WT and the liquid handling structure 12.

In an embodiment, the liquid handling structure 12 comprises at least one heater 34 but no sensors 30. In an arrangement of this type, the output from the heater 34 may be controlled by reference to the output of one or more temperature sensors provided in the table WT, for example. Optionally, the output from the heater 34 may be controlled by reference to a measurement of the position of the liquid handling structure 12. For example, the heater 34 in the liquid handling structure 12 may be activated when the measured relative position between the liquid handling structure 12 and the facing surface is such that the heater 34 is positioned above a portion of the facing surface that requires heating (as determined by the temperature sensor that is not on the liquid handling structure 12 for example). Embodiments which do not require a temperature sensor on the liquid handling structure 12 facilitate simpler construction of the liquid handling structure 12.

In an embodiment, the liquid handling structure 12 comprises at least one sensor 30 to measure the temperature of a portion of the facing surface adjacent to the sensor 30 but no heaters. In such an embodiment, the output from the sensor 30 may be used as the input for a control system that controls one or more heaters positioned in or on the substrate table WT, for example.

In an arrangement of the type of liquid confinement structure shown in FIG. 7, independent heating and independent sensing at a large number of positions is made possible without the attachment or integration of additional hardware to the table WT. The weight of the table WT may thereby be reduced and desirably minimized. Minimizing the weight of the table WT may be desirable because of the large accelerations and decelerations to the table WT. Large accelerations may be desirable to achieve rapid scanning of the table WT so as to achieve high throughput, for example.

The presence of a temperature sensor but not a heater on the fluid handling structure 12 helps to reduce the weight of the table WT, albeit to a potentially lesser extent than when the liquid confinement structure comprises both a sensor and a heater. Similarly, providing a heater but not a temperature sensor on the liquid handling structure helps to reduce the weight of the table WT, albeit to a potentially lesser extent than when both the sensor and heater are provided.

In an embodiment, the heater 34 comprises an infrared laser. The use of an infrared laser makes it possible for the heating to be applied to the facing surface, such as a surface of the substrate W or liquid located on the substrate W or a sensor, with high accuracy, in terms of position and/or dose.

The infrared laser may provide heating to the substrate W without significant residual heating of the liquid handling structure 12. However, alternative arrangements are possible. For example, the heater 34 may comprise an electrical heater configured to provide heat by driving a current through a resistive element.

In an embodiment, the heater comprises a fluid heater to heat fluid output from the liquid confinement structure 12 onto the substrate W.

Figure 8:
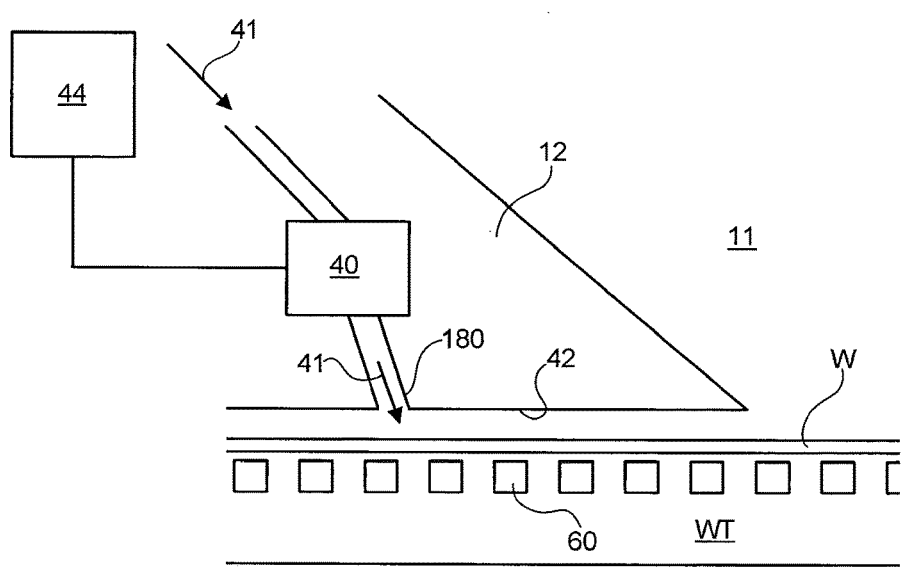
FIG. 8 depicts a gap fluid heater and control system configured to apply heated liquid to the substrate.

FIG. 8 is a schematic side view of a portion of a liquid handling structure 12 according to an example embodiment in which the at least one heater comprises a fluid heater. In the arrangement disclosed, the fluid heater comprises a gap fluid heater 40 that is configured to provide fluid to a gap between a fluid confinement surface 42 and the facing surface (e.g., substrate W). In this embodiment the fluid is provided through an opening 180 in the fluid confinement surface 42. The fluid confinement surface 42 is a surface substantially parallel to the facing surface. The fluid confinement surface 42 may be the undersurface of the liquid confinement structure, for example at the lowermost part of the liquid handling structure 12. The fluid confinement surface 42 defines in part the gap in which a seal, such as the gas seal 16 (not shown in FIG. 8), is effective to constrain the immersion liquid to remain within the space 11 (see FIG. 5, for example).

In an embodiment, it is desirable to supply liquid from the opening 180 into the gap between the fluid confinement surface 42 and the facing surface for example to help prevent a bubble entering the space 11 and/or to help prevent the fluid confinement surface inward of the opening 180 from de-wetting. In an embodiment, the liquid handling structure 12 may be configured to provide a continuous curtain of liquid from the opening 180. The opening 180 may comprise a plurality of discrete openings or may be formed as a continuous slit, for example. The continuous curtain of liquid may form a closed path (when viewed in a plane parallel to the plane of the substrate W) surrounding the space 11.

FIG. 8 illustrates an example in which the gap fluid heater 40 is configured to adapt the temperature of liquid 41 supplied to the opening 180 on the basis of a signal from a control system 44. In an embodiment, the control system 44 receives input from a temperature sensor 30 in the liquid handling structure 12. The temperature sensor may have a plurality of sensing elements. In an embodiment, there is a plurality of temperature sensors. In an embodiment, the control system 44 receives input from the temperature sensor in the liquid handling structure as well as from another sensor 60 that is not formed in the liquid handling structure, for example a sensor that is located in or on a table, such as a substrate table. In the example shown, a plurality of sensors 60 are provided in the upper surface of the substrate table WT. The sensor may be fixedly attached or connected to the table. In an embodiment, the control system 44 may receive input only from a sensor or sensors located in or on the table.

In an embodiment, a plurality of openings 180 may form a closed path surrounding the space 11 (in the plane of the fluid confinement surface 42 for example). The gap fluid heater 40 may be configured so as to be able to vary the heating applied to the fluid of the openings 180 as a function of peripheral (e.g., circumferential) position on the closed path. For example, the closed path may be segmented into a plurality of segments. Each segment may contain a certain, e.g. predetermined, number of openings 180. The gap fluid heater may be able to heat each segment, or the fluid flowing through the openings of each segment, independently.

Figure 9:
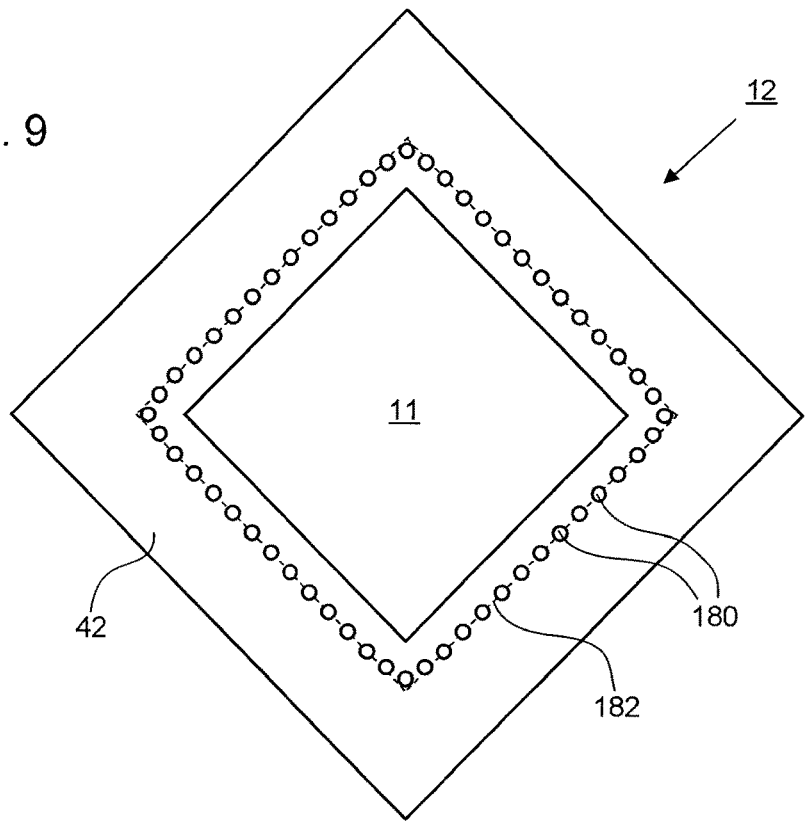
FIG. 9 depicts an example arrangement of openings in a liquid confinement surface, the openings arranged along a single closed path.
Figure 10:
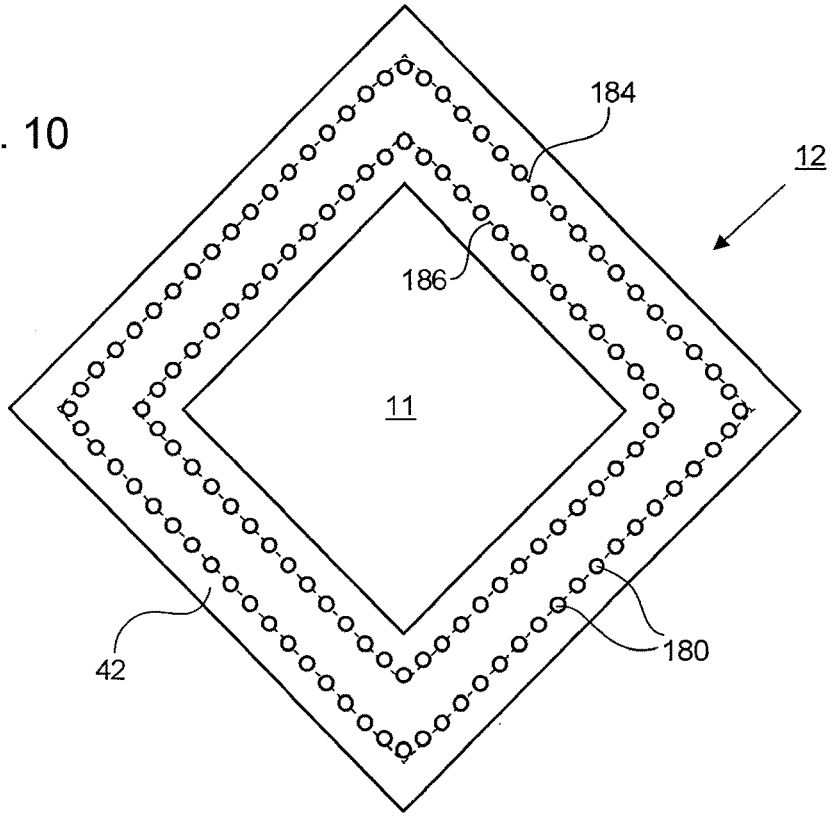
FIG. 10 depicts a further example arrangement of openings in a liquid confinement surface, the openings arranged along two closed paths.
Figure 11:
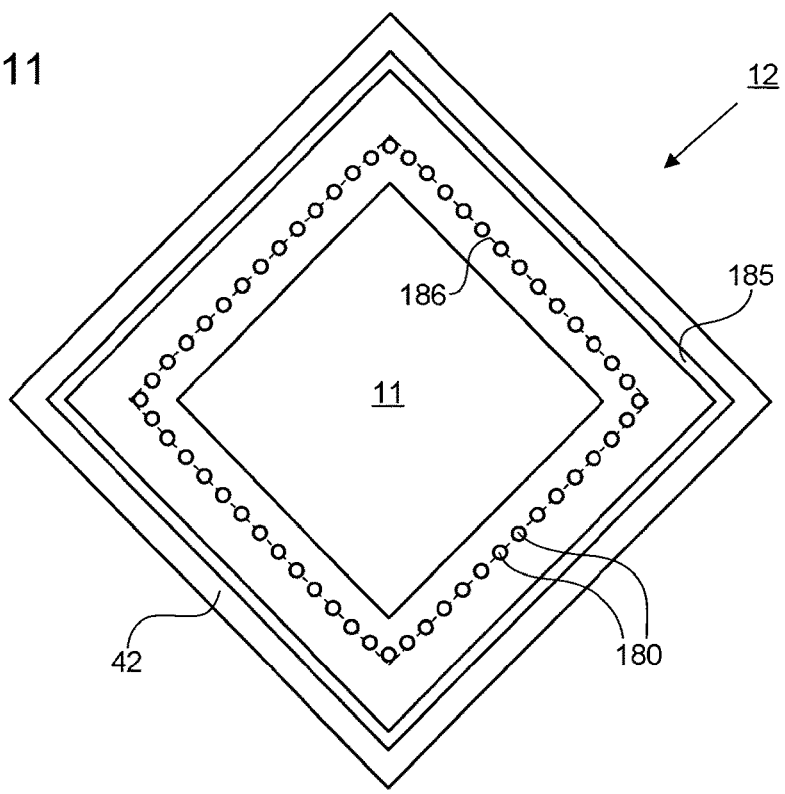
FIG. 11 depicts a further example arrangement of openings in a liquid confinement surface, the openings comprising a plurality of openings arranged along a closed path and a continuous slit opening.

FIGS. 9 to 11 are schematic bottom views of the fluid handling structure 12 showing the positions of the openings 180 according to three example embodiments. In the arrangement of FIG. 9, a plurality of openings 180 are provided that form a single closed path 182 surrounding an aperture to the immersion space 11. (The aperture is a rim of the fluid confinement surface 42). In an embodiment, the openings 180 are closely spaced. For example, the spacing between neighboring openings 180 may be of the order of 1 mm or less. The openings 180 may be positioned at any spacing that is at least partially effective to block the passage of bubbles into the space 11. The particular spacing to block passage of bubbles may depend on a number of factors. These factors may include one or more selected from the following for example: the viscosity of the liquid supplied through the openings 180, the dimensions of the openings 180, the shape of the openings 180, and/or the rate at which the liquid is delivered through the openings 180.

In the arrangement of FIG. 10, the openings 180 are arranged along two different closed paths 184,186. The two different closed paths 184,186 are radially separated from each other. In an embodiment, more than two closed paths of openings 180 may be provided. In an embodiment having more than one closed path of openings 180, the outermost closed path of openings 180 will be primarily (or entirely) responsible for helping to prevent bubbles from entering the space 11. In an embodiment of this type, closed paths of openings other than the outermost closed path (such as the closed path 186) may be provided purely to increase the extent to which the temperature of the substrate W can be controlled. More generally, the provision of more than one closed path of openings 180 makes it possible to provide a greater overall flow of liquid via the openings 180. Providing a greater overall flow makes it possible to apply more heating to the facing surface. Providing more than one closed path of openings 180 may also increase the surface area over which heating may be applied at any given time.

FIG. 11 illustrates an embodiment comprising a closed path 186 of openings 180 and a continuous slit 185. Closed path 186 is similar to the closed path 186 illustrated in FIG. 9. In this example, the continuous slit 185 is formed radially outside of the closed path 186 of openings 180. However, this is not essential. The continuous slit 185 could be positioned radially inside of the closed path 186 of openings 180. Where more than two closed paths are provided, any combination of continuous slits or closed paths of openings 180 may be provided.

In the examples depicted, the openings 180 are shown as having a circular cross-section, but other forms are possible. For example, one or more of the openings 180 may be provided in an elongate form. The elongate form may be aligned for example with the direction of the closed path in the vicinity of the elongate opening. Alternatively or additionally, the elongate form may be aligned perpendicularly to the closed path or in any other direction. The alignment of the elongate openings may be angled between the closed path and the perpendicular to the closed path. The elongate openings may overlap each other with respect to the direction of motion of a facing surface, such as a substrate surface, underneath the liquid confinement structure. The openings may have any other shape. The openings may all have the same shape, may have different shapes or may have a shapes which for a repeating series is a linear or two dimensional array, for example along at least part of a closed path.

In the embodiments shown in FIGS. 9 to 11, all of the openings 180 are provided in closed paths. However, this is not essential. If the openings 180 along the outermost closed path are effective to block bubbles to the desired extent, additional openings provided inside of the outermost closed path need not be provided along a closed path. It is also not necessary to arrange for these additional openings to be closely spaced enough to block bubbles. However, the additional openings can be closely spaced if desired. The additional openings can also be arranged along closed paths if desired. Arranging the additional openings along closed paths may be convenient for supplying the additional openings with liquid, for example, even if the closed path is not necessary for blocking bubbles. Such arrangements of openings may be arranged to optimize the conditioning effect of the immersion liquid on the substrate.

In an embodiment in which openings 180 are provided along a plurality of closed paths, the gap fluid heater 40 may be configured to supply liquid to openings 180 along a first closed path at a first temperature and to openings 180 along a second closed path at a second temperature. The first temperature may be the same as or different to the second temperature. In an embodiment comprising openings arranged along two different closed paths, the temperature of liquid provided to an outermost path may be configured to be larger than the temperature of liquid provided to an innermost path. This configuration is likely to be particularly effective where cooling is larger towards an outer periphery of the liquid handling structure 12.

Figure 12:
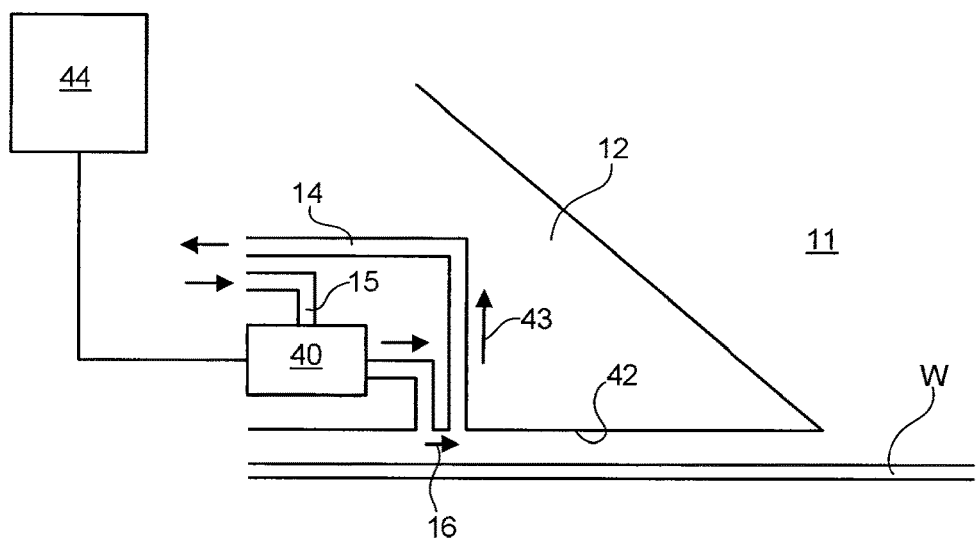
FIG. 12 depicts a gap fluid heater and control system configured to apply heated gas to the substrate.

FIG. 12 is a schematic illustration of an example embodiment in which the gap fluid heater 40 is configured to heat gas supplied to a gas flow 43, such as a seal 16. Note that the gas flow supplied through an opening in the undersurface of a liquid confinement structure need not be a gas seal. Gas can be supplied for different reasons, for example to form a different atmosphere in the environment immediate to a meniscus, such as an environment with a large carbon dioxide concentration, see U.S. Patent Application Publication No. US 2011/0134401 A1 which is hereby incorporated by reference in its entirety. Such a gas flow can be thermally conditioned in the manner described for a gas seal. In an embodiment, the gas fluid heater 40 is configured to receive a control signal from the control system 44 described above for a gas fluid heater 40 to heat a liquid flow.

In an embodiment, the control system 44 is configured to control the output from the at least one heater on the basis of measurements of the temperature at a plurality of different positions on a facing surface, such as the substrate W, a sensor on a table, a substrate table supporting the substrate or adjacent the substrate or any combination of these locations. Taking the substrate by way of example of these locations, the measurements of the temperature of the substrate W at a plurality of different positions on the substrate W can be obtained by receiving input from temperature sensors 30 at different locations. The temperature sensors 30 that are positioned at different points on the liquid handling structure 12 may supply measurement signals to the control system 44 representative of the temperature of a portion of the substrate passing under the respective sensor. The temperature sensors sensing the temperature of a fixed location of the substrate W, for example a sensor located on the substrate table, under the substrate, transmit signals to the control system 44 at appropriate times during scanning of the substrate W. The control system may receive signals from the sensors on the substrate table WT in advance of, and during, the passage of each sensor (and the substrate) under the immersion space 11. The control system 44 may use the signals from the sensors (whether on the substrate table, in contact with the substrate, on the liquid confinement structure or associated with a sensor (such as an optical sensor) on a table) to control the gas fluid heater 40. The surface under the liquid confinement structure may thereby improve the thermal conditioning of the substrate.

The aforementioned description is directed at a problem of increased thermal instability caused by using a larger substrate in an exposure tool. The description refers to active heating and sensing techniques. In combination or alternatively, a different solution may be used which is as described as follows.

A substrate with a width (e.g., diameter) larger than current standards, for example of 450 mm diameter, as compared to a substrate with a diameter of 300 mm, has a larger surface area. The surface may be more than twice as large, for example it may be larger by a factor of 2.25. However, unless the design of the liquid confinement structure is altered, the surface area of the wet footprint of the liquid confined in the liquid confinement structure (i.e. the area of a facing surface such as a substrate underneath the immersion space) is the same as in existing commercial designs.

The liquid in the immersion space is conditioned within a specified accuracy. For example, the liquid may be controlled to within about 3 mK. The flow of immersion liquid through the space helps to thermally condition the surface under the immersion space. However when the surface area of the substrate increases for example by a factor of about two and the maximum portion of the substrate under the wet footprint is unchanged, the proportion of the substrate covered by the wet footprint is reduced. The effect of the thermal conditioning on the substrate is also smaller as compared to current commercial immersion tools which process a 300 mm substrate.

The thermal conditioning effect of the immersion space on the substrate may be dependent on the frequency with which the substrate passes under the immersion space. The frequency may be dependent upon the path the substrate takes under the immersion space. In an embodiment, the substrate passes under the immersion space such that lines of dies across the substrate are successively imaged on the substrate. The larger the width (e.g., diameter) of the substrate, the less frequently the substrate passes under the immersion space for a given scan speed. For example for a 450 mm substrate relative to a 300 mm substrate, the diameter of the substrate is fifty percent larger, so it will take longer to expose a line of dies across the substrate at a given scan speed. Liquid which is removed by the liquid confinement structure on exposing a subsequent line of dies on the substrate remains on the substrate before being removed. The liquid has a longer time to evaporate. The risk of thermal distortion caused by evaporating droplets can be expected to increase.

A possible solution to this problem is for the size of the footprint of the immersion space to increase. The footprint (also referred to as "wet footprint") is the area of contact of the immersion fluid with the facing surface below the immersion space.

Figure 13:
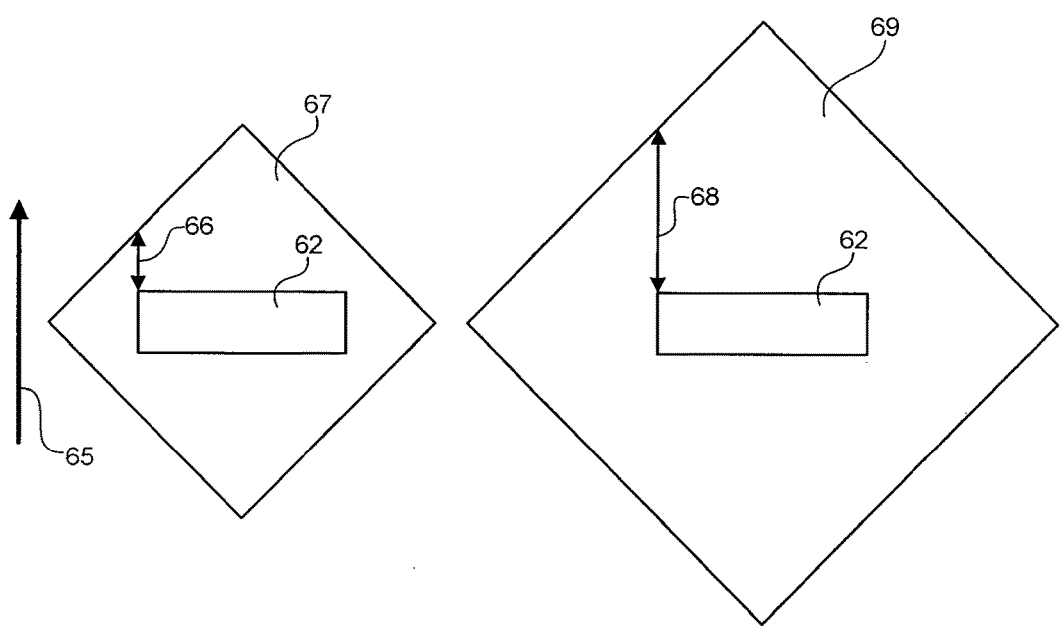
FIG. 13 depicts an enlarged immersion liquid footprint.

An enlarged wet footprint is illustrated schematically in FIG. 13. In the left part of the diagram, the wet footprint 67 of an existing commercial liquid confinement structure (i.e. for a 300 mm immersion system) is depicted. In the right part of the diagram, an enlarged wet footprint 69 according to an embodiment is depicted. An example scanning direction is indicated by arrow 65. The portion 62 of the wet footprint 67, 69 through which the radiation will be incident on the facing surface (e.g., a surface of the substrate W) (the "exposure slit") is indicated in a central portion of each wet footprint 67, 69. In an embodiment, the exposure slit 62 is rectangular. In an existing commercial liquid immersion system for 300 mm substrates, the exposure slit 62 may be a 26 mm×5 mm rectangle.

Even if the exposure slit dimensions remain the same (as in the embodiment shown in FIG. 13), increasing the surface area of the footprint 69 can help to improve the thermal conditioning of the facing surface. For example, a larger footprint thermally conditions the substrate for longer. This is illustrated by the lengths 66 and 68 in FIG. 13 which represent the distance in the scanning direction between a given part of the exposure slit and the boundary to the wet footprint 67, 69 for the standard and enlarged footprints respectively. The length 68 is longer than the length 66, which means that for a given scan speed a given portion of the facing surface is in contact with the immersion liquid for a longer period of time. A larger footprint can collect droplets over a larger area of the facing surface, helping to reduce the time a droplet remains to evaporate on the surface of the facing surface, before being removed.

In an embodiment, a significant improvement may be noted when using a liquid confinement structure which has a wet footprint which is at least fifty percent larger in width (e.g., diameter) than the wet footprint of an existing commercial liquid confinement structure, i.e. for a 300 mm immersion system. Desirably, the footprint surface area is at least twice the area or more than a 300 mm immersion system, desirably larger by a factor of at least 2.25. With such surface area, the ratio of the substrate surface area to the footprint surface area is the same for a 300 mm substrate immersion system as a 450 mm substrate immersion system. The wet footprint of such a 300 mm immersion system would typically be about 65 mm×65 mm, which corresponds to a wet footprint area of about 4200 $mm^2$. Increasing the width (e.g., diameter) of the wet footprint by fifty percent would therefore correspond to increasing the area of the wet footprint to be greater than about 9500 $mm^2$. Desirably, the area of the wet footprint is thus greater than or equal to 9500 $mm^2$, or greater than or equal to 12000 $mm^2$.

In an embodiment, the area of the wet footprint area is increased without a corresponding increase in the size of the area of the substrate W that can be exposed with radiation at a given time (the exposure slit 62). The size of the exposure slit 62 may stay the same or may increase by a different factor than the increase in area of the wet footprint. In an embodiment, the ratio of the area of the exposure slit 62 to the area of the wet footprint is greater than or equal to 60, or greater than or equal to 90. For example, in the case where the exposure slit is maintained as a rectangle having dimensions of 26 mm×5 mm and the area of a wet footprint is increased to 9500 $mm^2$, the ratio of the area of the exposure slit to the area of the wet footprint would be 73.

In an embodiment it is desirable to achieve a balance between the improved conditioning that is achieved by increasing the size of the wet footprint and potential engineering difficulties associated with accommodating the larger footprint. For example, a larger footprint may require an increase in the size of the table WT because in an embodiment no portion of the wet footprint should be allowed to advance beyond the edge of the table WT. In an embodiment, the table WT may need to have a region that can accommodate all of the area of the wet footprint when the wet footprint is positioned so as to have no overlap with the region where the substrate is positioned or will be positioned.

In an arrangement an immersion system for a liquid confinement structure with an increased immersion footprint, the liquid confinement structure comprises one or more sensors as herein described to help improve thermal control and stability.

In an embodiment, there is provided a fluid handling structure for a lithography apparatus, the structure configured to confine an immersion fluid in a space between a final element of a projection system and a facing surface during movement of the facing surface relative to the structure, wherein the structure comprises: a heater configured to heat a portion of the facing surface adjacent to the heater, the heater comprising a fluid heater to heat fluid flow from the structure onto the facing surface, the heated fluid flow heating the portion.

In an embodiment, there is provided a fluid handling structure for a lithography apparatus, the structure configured to confine an immersion fluid in a space between a final element of a projection system and a facing surface during movement of the facing surface relative to the structure, wherein the structure comprises: a heater configured to heat a portion of the facing surface adjacent to the heater, the heater comprising a plurality of elements arranged in a closed path around the space.

In an embodiment, the fluid handling structure further comprises a sensor configured to measure a temperature of a portion of the facing surface adjacent to the sensor. In an embodiment, the fluid handling structure comprises a fluid confinement surface facing the facing surface and having an opening. In an embodiment, the heater comprises a gap fluid heater configured to heat fluid which flows through the opening. In an embodiment, the opening is arranged in a closed path. In an embodiment, the opening is a plurality of openings. In an embodiment, the gap fluid heater is configured to provide heating to fluid flow from the plurality of openings so that the temperature of the fluid flow varies selectively as a function of position along a closed path. In an embodiment, the plurality of openings are arranged along a plurality of closed paths, each closed path radially separated from another of the closed paths. In an embodiment, the heater comprises a gap fluid heater that is configured to heat fluid output from the plurality of openings, the gap fluid heater configured to provide fluid to the openings along a first one of the plurality of closed paths that is at a different temperature to fluid provided to openings along a second one of the plurality of closed paths. In an embodiment, the first closed path is radially outside of the second closed path and the temperature of fluid supplied to the openings along the first closed path is higher than the temperature of fluid supplied to the openings along the second closed path. In an embodiment, the gap fluid heater is configured to provide fluid at the same temperature to openings arranged along at least two different closed paths. In an embodiment, the opening comprises a continuous slit or is a plurality of openings. In an embodiment, the fluid flow from the structure includes a liquid. In an embodiment, the fluid flow from the structure includes a gas, wherein if the fluid includes a liquid, the liquid fluid flow is supplied through a different opening in the fluid handling structure from the gas fluid flow. In an embodiment, the fluid handling structure comprises a control system configured to control the output from the heater on the basis of a measurement of a temperature of the facing surface. In an embodiment, the control system is configured to control the output from the heater on the basis of measurements of the temperature of the facing surface at a plurality of different positions on the facing surface. In an embodiment, the control system is configured to control the output from the heater on the basis of measurements of the temperature of the facing surface at a plurality of different times. In an embodiment, the fluid handling structure comprises a sensor configured to measure a temperature of a portion of the facing surface adjacent to the sensor, wherein the control system is configured to control the output from the heater on the basis of a measurement of the temperature of the facing surface output by the sensor. In an embodiment, the heater comprises an infrared laser.

In an embodiment, there is provided a fluid handling structure for a lithography apparatus, the structure configured to confine an immersion fluid in a space between a final element of a projection system and a facing surface during movement of the facing surface relative to the structure, the structure comprising a sensor configured to measure a temperature of a portion of the facing surface underneath the sensor.

In an embodiment, the sensor comprises a plurality of elements arranged in a closed loop around the space.

In an embodiment, there is provided a fluid handling structure for a lithography apparatus, the structure configured to confine an immersion fluid in a space between a final element of a projection system and a facing surface during movement of the facing surface relative to the structure, and configured such that the area of contact of the immersion fluid with the facing surface in the space is greater than 9500 mm$^2$.

In an embodiment, there is provided a fluid handling structure for a lithography apparatus, the structure configured to confine an immersion fluid in a space between a final element of a projection system and a facing surface during movement of the facing surface relative to the structure, and configured such that a ratio of the area of contact of the immersion fluid with the facing surface in the space to the area of a substrate that can be exposed with radiation at a given time is greater than 60.

In an embodiment, the fluid handling structure is configured for use with a lithography apparatus that is configured to expose substrates of 450 mm diameter. In an embodiment, the facing surface comprises a surface of a radiation-sensitive substrate. In an embodiment, the facing surface comprises a surface of a substrate table to support the substrate. In an embodiment, the facing surface comprises a surface of a sensor supported by the substrate table. In an embodiment, the facing surface comprises a surface of a table to support a sensor.

In an embodiment, there is provided an immersion lithography apparatus, comprising the fluid handling structure as described herein.

In an embodiment, there is provided a method of operating a lithography apparatus, comprising: projecting a patterned beam of radiation through an immersion liquid confined to a space between a final element of a projection system and a facing surface by a fluid handling structure; moving the facing surface relative to the fluid handling structure while maintaining confinement of the immersion liquid; and using a heater to heat a portion of the facing surface adjacent to the heater, the heater comprising a fluid heater heating fluid flow from the structure onto the facing surface, the heated fluid flow heating the portion.

In an embodiment, there is provided a method of operating a lithography apparatus, comprising: projecting a patterned beam of radiation through an immersion liquid confined to a space between a final element of a projection system and a facing surface by a fluid handling structure; moving the facing surface relative to the fluid handling structure while maintaining confinement of the immersion liquid; and using a heater to heat a portion of the facing surface adjacent to the heater, the heater comprising a plurality of elements arranged in a closed path around the space.

In an embodiment, there is provided a method of operating a lithography apparatus, comprising: projecting a patterned beam of radiation through an immersion liquid confined to a space between a final element of a projection system and a facing surface by a fluid handling structure; moving the facing surface relative to the fluid handling structure while maintaining confinement of the immersion liquid; and using a sensor forming part of the fluid handling structure to measure a temperature of a portion of the facing surface underneath the sensor.

In an embodiment, there is provided a method of operating a lithography apparatus, comprising: projecting a patterned beam of radiation through an immersion liquid confined to a space between a final element of a projection system and a facing surface by a fluid handling structure; and moving the facing surface relative to the fluid handling structure while maintaining confinement of the immersion liquid, wherein the structure is configured such that the area of contact of the immersion fluid with the facing surface in the space is greater than 9500 mm$^2$.

In an embodiment, there is provided a method of operating a lithography apparatus, comprising: projecting a patterned beam of radiation through an immersion liquid confined to a space between a final element of a projection system and a facing surface by a fluid handling structure; and moving the facing surface relative to the fluid handling structure while maintaining confinement of the immersion liquid, wherein the structure is configured such that the ratio of the area of contact of the immersion fluid with the facing surface in the space to the area of the substrate that can be exposed with radiation at a given time is greater than 60.

Any of the above described features can be used with any other feature and it is not only those combinations explicitly described which are covered in this application. For example, an embodiment of the invention could be applied to the embodiments of FIGS. 2 to 4.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A fluid handling structure for a lithography apparatus, the fluid handling structure configured to confine an immersion fluid in a space between a final element of a projection system and a movable facing surface, wherein the fluid handling structure comprises:
    an aperture configured to allow a beam of radiation to pass therethrough toward the movable facing surface;
    a first opening configured to supply a first liquid to above the aperture and so as to have the first liquid contact the movable facing surface;
    a fluid confinement surface facing the movable facing surface, the movable facing surface being movable relative to the fluid confinement surface;
    a second opening that is located in the fluid confinement surface, the second opening facing the movable facing surface and the second opening configured to supply a second liquid to the space so as to have the second liquid contact the movable facing surface; and
    a heater system configured to heat a portion of the movable facing surface adjacent to the second opening, the heater system comprising a fluid heater to heat a flow of the second liquid, wherein the heated second liquid flow passes through at least part of the fluid handling structure and out through the second opening to contact the movable facing surface, the heated second liquid flow arranged to heat the portion.

2. The fluid handling structure of claim 1, further comprising a sensor configured to measure a temperature of a portion of the movable facing surface adjacent to the sensor.

3. The fluid handling structure of claim 1, wherein the second opening is arranged in a closed path.

4. The fluid handling structure of claim 1, wherein the second opening comprises a plurality of apertures to provide the heated second liquid flow onto the movable facing surface.

5. The fluid handling structure of claim 4, wherein the plurality of apertures are arranged along a plurality of closed paths, each closed path radially separated from another of the closed paths.

6. The fluid handling structure of claim 5, wherein the heater system is configured to provide fluid to the apertures along a first one of the plurality of closed paths that is at a different temperature to fluid provided to apertures along a second one of the plurality of closed paths.

7. The fluid handling structure of claim 1, wherein the fluid heater is configured to provide fluid at substantially the same temperature to apertures of the opening arranged along at least two different closed paths.

8. The fluid handling structure of claim 1, comprising a control system configured to control the output from the fluid heater on the basis of a measurement of a temperature of the movable facing surface.

9. The fluid handling structure of claim 8, wherein the control system is configured to control the output from the fluid heater on the basis of measurements of the temperature of the movable facing surface at a plurality of different positions on the movable facing surface.

10. The fluid handling structure of claim 8, wherein the control system is configured to control the output from the fluid heater on the basis of measurements of the temperature of the movable facing surface at a plurality of different times.

11. The fluid handling structure of claim 8, comprising a sensor configured to measure a temperature of a portion of the movable facing surface adjacent to the sensor, wherein the control system is configured to control the output from the fluid heater on the basis of a measurement of the temperature of the movable facing surface output by the sensor.

12. An immersion lithography apparatus, comprising:
a projection system configured to transfer a pattern onto a substrate; and
a fluid handling structure, the fluid handling structure configured to confine an immersion fluid in a space between a final element of the projection system and a movable facing surface, wherein the fluid handling structure comprises:
an aperture configured to allow a beam of radiation to pass therethrough toward the movable facing surface;
a first opening configured to supply a first liquid to above the aperture and so as to have the first liquid contact the movable facing surface;
a fluid confinement surface facing the movable facing surface, the movable facing surface being movable relative to the fluid confinement surface;
a second opening that is located in the fluid confinement surface, the second opening facing the movable facing surface and the second opening configured to supply a second liquid to the space so as to have the second liquid contact the movable facing surface; and
a heater system configured to heat a portion of the movable facing surface adjacent to the second opening, the heater system comprising a fluid heater to heat a flow of the second liquid, wherein the heated second liquid flow passes through at least part of the fluid handling structure and out through the second opening to contact the movable facing surface, the heated second liquid flow arranged to heat the portion.

13. A method of operating a lithography apparatus, the method comprising:
supplying a first liquid to a space between a final element of a projection system and a movable facing surface via a first opening of a fluid handling structure, wherein the first opening supplies the first liquid to above an aperture of the fluid handling structure so as to have the first liquid contact the movable facing surface and the movable facing surface faces a fluid confinement surface of the fluid handling structure;
projecting a patterned beam of radiation through the aperture and through at least the first liquid toward the movable facing surface;
moving the movable facing surface relative to the fluid confinement surface of the fluid handling structure while maintaining confinement of at least part of the first liquid, the fluid confinement surface having a second opening configured to supply a second liquid to the space, the second opening facing the movable facing surface;
heating a flow of the second liquid-flew using a fluid heater; and
supplying the heated second liquid flow through the second opening to contact the movable facing surface to heat a portion of the movable facing surface adjacent to the second opening, wherein the heated second liquid flow passes through at least part of the fluid handling structure and out through the second opening to contact the movable facing surface, the heated second liquid flow heating the portion.

14. A fluid handling structure for a lithography apparatus, the fluid handling structure configured to confine an immersion fluid in a space between a final element of a projection system and a movable facing surface, wherein the fluid handling structure comprises:
a first opening configured to supply a first liquid to the space so as to have the first liquid contact the movable facing surface;
a fluid confinement surface facing the movable facing surface, the movable facing surface being movable relative to the fluid confinement surface;
a second opening that is located in the fluid confinement surface, the second opening facing the movable facing surface and the second opening configured to supply a second liquid to the space so as to have the second liquid contact the movable facing surface;
a heater configured to control the temperature of the second liquid, wherein the temperature controlled second liquid passes through at least part of the fluid handling structure and out through the second opening to contact the movable facing surface; and
a control system configured to separately control the temperatures of the first and second liquids.

15. The fluid handling structure of claim 14, wherein the first and second liquid are of the same material.

16. The fluid handling structure of claim 14, wherein the opening comprises a plurality of apertures arranged along a closed path around the center of the fluid handling structure.

17. A fluid handling structure for a lithography apparatus, the fluid handling structure configured to confine an immersion fluid in a space between a final element of a projection system and a movable facing surface, the fluid handling structure comprising:
a fluid confinement surface facing the movable facing surface, the movable facing surface being movable relative to the fluid confinement surface;
a first opening configured to supply a first liquid to the space so as to have the first liquid contact the movable facing surface;
a second opening that is located in the fluid confinement surface, the second opening facing the movable facing surface, the second opening configured to supply a second liquid to the space so as to have the second liquid contact the movable facing surface, and the second opening is located, relative to the center of the space, outward of the first opening; and
a heater system configured to separately control the temperatures of the first and second liquids wherein the temperature controlled first and second liquids respectively pass through at least part of the fluid handling structure and out through the respective first and second openings to contact the movable facing surface.

18. The fluid handling structure of claim 17, wherein the first and/or second opening comprises a plurality of apertures.

19. The fluid handling structure of claim 17, wherein the first and second liquid are of the same material.

20. The fluid handling structure of claim 17, wherein the heater system is configured to provide first and second liquid at different temperatures to the respective first and second openings.

* * * * *